(12) United States Patent
Kesler

(10) Patent No.: US 6,956,410 B2
(45) Date of Patent: Oct. 18, 2005

(54) AUTOMOTIVE IGNITION SYSTEM WITH BATTERY DEPENDENT OVER-DWELL PROTECTION

(75) Inventor: Scott B. Kesler, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/713,138

(22) Filed: Nov. 13, 2003

(65) Prior Publication Data

US 2005/0104630 A1 May 19, 2005

(51) Int. Cl.[7] ............................................. H03K 5/22
(52) U.S. Cl. ........................... 327/89; 327/77; 327/90
(58) Field of Search .............................. 327/89, 77, 78, 327/79, 80, 81, 82, 88, 90, 51, 52, 63, 65, 68, 96; 330/261, 252, 267, 277

(56) References Cited

U.S. PATENT DOCUMENTS

| | | | | |
|---|---|---|---|---|
| 3,790,897 A | * | 2/1974 | Wheatley, Jr. ............... | 330/261 |
| 4,456,840 A | * | 6/1984 | Ide et al. ....................... | 327/89 |
| 4,490,685 A | * | 12/1984 | Sano .............................. | 330/252 |
| 4,536,717 A | * | 8/1985 | Hauge et al. ................ | 330/254 |
| 5,134,309 A | * | 7/1992 | Matsumoto et al. ......... | 327/100 |
| 5,819,713 A | | 10/1998 | Kesler .......................... | 123/630 |
| 6,369,646 B1 | | 4/2002 | Kesler et al. ................ | 327/564 |

* cited by examiner

Primary Examiner—Tuan T. Lam
Assistant Examiner—Hiep Nguyen
(74) Attorney, Agent, or Firm—Stefan V. Chmielewski

(57) ABSTRACT

A technique for reducing input currents associated with a comparator circuit during certain events includes minimizing bias currents associated with the comparator circuit when a magnitude of an input signal at a signal input of the comparator circuit is a predetermined value from a magnitude of a reference signal applied to a reference input of the comparator circuit. The bias currents are increased when the magnitude of the input signal is within the predetermined value of the magnitude of the reference signal.

23 Claims, 4 Drawing Sheets

AUTOMOTIVE IGNITION SYSTEM WITH BATTERY DEPENDENT OVER-DWELL PROTECTION

TECHNICAL FIELD

The present invention is generally directed to an automotive ignition system and, more specifically, an automotive ignition system with battery dependent over-dwell protection.

BACKGROUND OF THE INVENTION

Many modern automotive ignition systems feature separate ignition coil assemblies for each cylinder of an engine. These assemblies have included an ignition coil, as well as interface and control electronics, typically in the form of silicon integrated circuits. Due to the fact that the assemblies are distributed around the engine, the assemblies are generally connected to an engine control module by a relatively lengthy wiring harness. Such wiring harnesses are susceptible to wiring insulation faults which can result in improper electronic spark timing (EST) signals being received by one or more of the assemblies, possibly resulting in excessively long "on" or "dwell" times. Excessively long dwell times can result in damage to or destruction of a coil or a coil current switching device of the assemblies.

To minimize damage to the assemblies, many modern ignition systems employ over-dwell protection timers to limit the maximum period of time that a coil can be energized for any given dwell event. Additionally, such systems may also employ a noise filtering timer function that prevents disruption of the protection timer circuitry for a short period of time after a timeout event. Such filtering is usually necessary due to the fact that when the ignition coil current is shut off at the end of the maximum allowed time a spark event may occur, producing significant amounts of radiated noise. Such noise can potentially reset dwell limiting circuitry, resulting in another timeout period being allowed to occur. This can repeat indefinitely, resulting in the same type of damage to the coil assembly that the over-dwell protection timer was intended to prevent. The noise filtering timer function, i.e., blinding timer circuitry, may be implemented using the same capacitor as is used for the maximum dwell timing by simply discharging the capacitor from its timeout reference voltage down to a lower reference voltage.

In order to optimize spark energy delivery it is desirable to have longer maximum dwell limitations at lower battery voltages when the coils charge more slowly due to the lower voltage. At higher battery voltages, the coils charge more quickly allowing for a reduction in the maximum allowed dwell time without limiting the amount of energy in the coil. Typical timer circuits compensate for different battery voltages by charging a capacitor in a controlled fashion until the voltage across the capacitor reaches a predetermined level. A basic technique of creating the desired battery voltage dependency in the over-dwell protection timer is to charge the capacitor by means of a resistor connected to a battery line.

Due to packaging area constraints and cost considerations, it is desirable to keep the timing capacitor value as low as possible, typically about 0.1 uF. For maximum dwell times of tens of milliseconds, the charging resistor will typically be several megaohms. With such a high impedance charging path, the charging currents are very small and any perturbations to this capacitor charging current can result in significant variations in the time needed to charge the capacitor to the reference level.

Due to cost considerations and the need to operate in the presence of high voltage transient noise impulses, the interface/control ICs are typically implemented using bipolar transistor processes. Because of the nature of bipolar transistors and their need for a finite amount of base drive current for operation, design of the circuitry that compares the capacitor voltage to the predefined reference voltage becomes problematic given the need to limit perturbations to the charging of the timing capacitor. Additionally, the blinding timer circuitry, which is tied to the timing capacitor, represents another possible source of error current.

What is needed is a technique for implementing dwell timing functions in such a manner as to limit error currents typically associated with bipolar comparators. It would also be desirable to allow for the inclusion of blinding timer functions, without additional perturbation of dwell times.

SUMMARY OF THE INVENTION

According to an embodiment of the present invention a technique for reducing input currents associated with a comparator circuit during certain events is disclosed. According to the technique, bias currents associated with the comparator circuit are minimized when a magnitude of an input signal at a signal input of the comparator circuit is a predetermined value from a magnitude of a reference signal applied to a reference input of the comparator circuit. Further, the bias currents associated with the comparator circuit are increased when the magnitude of the input signal is within the predetermined value of the magnitude of the reference signal.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to various embodiments of the present invention a technique for reducing input currents associated with a comparator circuit during certain events is disclosed.

According to the technique, bias currents associated with the comparator circuit are minimized when a magnitude of an input signal at a signal input of the comparator circuit is a predetermined value from a magnitude of a reference signal applied to a reference input of the comparator circuit. Further, the bias currents associated with the comparator circuit are increased when the magnitude of the input signal is within the predetermined value of the magnitude of the reference signal.

Figure 1A:
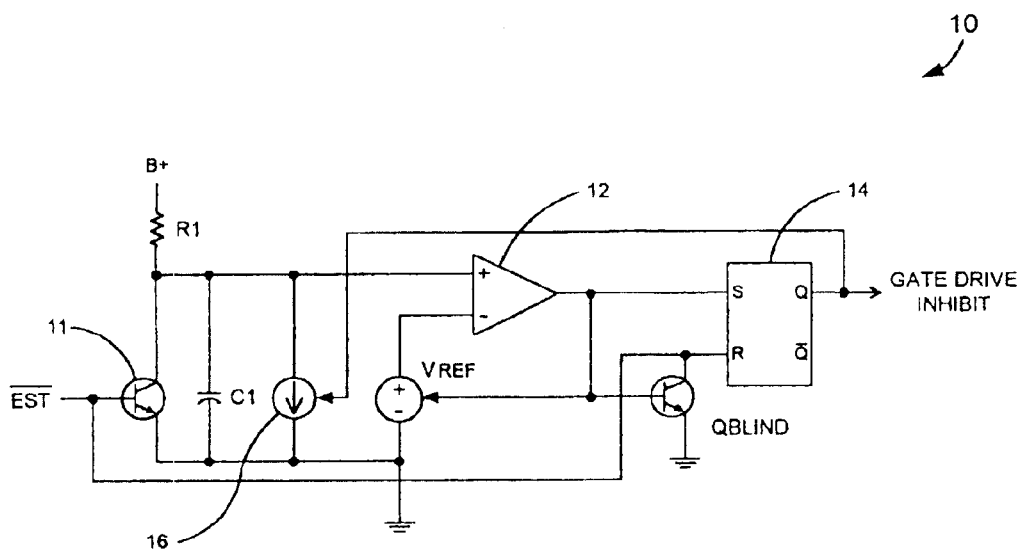
FIG. 1A is an electrical schematic of an exemplary over-dwell protection circuit implemented with a blinding timer.
Figure 1B:
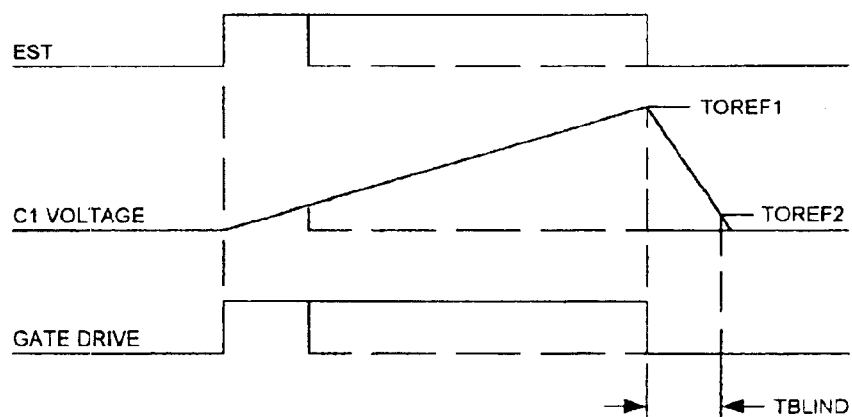
FIG. 1B is a timing diagram depicting functional operation of the circuit of FIG. 1A.

FIGS. 1A and 1B show a basic electrical schematic 10 of circuitry to implement over-dwell and blinding timer functions and exemplary waveforms illustrating functional operation of the circuitry, respectively. During normal operation, when an electronic spark timing (EST) signal voltage rises, a coil current switching device is turned on and coil charging begins with activation of the coil current switching device. Simultaneously therewith, a logic signal, i.e., an inverted version of the EST signal, turns off transistor 11. When the transistor 11 is turned on, timing capacitor C1 is shorted and, as such, is in a discharged state. When the transistor 11 is turned off, the capacitor C1 begins charging via current delivered by resistor R1, which is coupled between a battery at a voltage B+ and the capacitor C1. The charging current continues (for a time TOREF1) until the voltage across the capacitor C1 reaches a voltage level defined by a reference voltage Vref applied to an inverting input of comparator 12.

When the voltage on the capacitor C1 reaches the reference voltage Vref, the output of the comparator 12 switches high, setting a latch 14. Once set, the latch 14 provides a gate drive inhibit signal to terminate a drive signal applied to a gate of the coil current switching device, for example, an insulated gate bipolar transistor (IGBT). The latch 14, when set, also turns on a current source 16, which provides a discharge current for the capacitor C1. The discharge current is designed to exceed the current supplied to the capacitor C1 (through the resistor R1) and, as such, the capacitor C1 begins to discharge. The switching of the comparator 12 output also initiates reduction of the reference voltage Vref to a lower level. During the discharge period, transistor Qblind holds the reset input of the latch 14 low, effectively preventing spark induced noise at the EST input from performing a reset of the latch 14. The discharge of the capacitor C1 continues and the voltage on the capacitor C1 drops to a second lower voltage level (at time TOREF2). Once the voltage across the capacitor C1 reaches the second lower voltage level, the output of the comparator 12 switches back to a low state turning the transistor Qblind off thereby releasing the reset input of the latch 14.

With an understanding of the basic timer functions, it should be appreciated that currents into or out of the non-inverting input of the comparator 12, the transistor 11, or the discharge current source 16 (during the charging period) affect the over-dwell time. In order to prevent significant modification of the over-dwell time, it is generally desirable that these currents not have a net total exceeding more than a few tens of nanoamps. According to one embodiment of the present invention, a comparator circuit constructed according to the present invention provides a substantial reduction in input currents while preserving the accuracy of the comparator function. Additionally, a blinding timer function may be included that is designed to limit the amount of leakage current attributable to the discharge current source coupled to the timing capacitor node.

Figure 2:
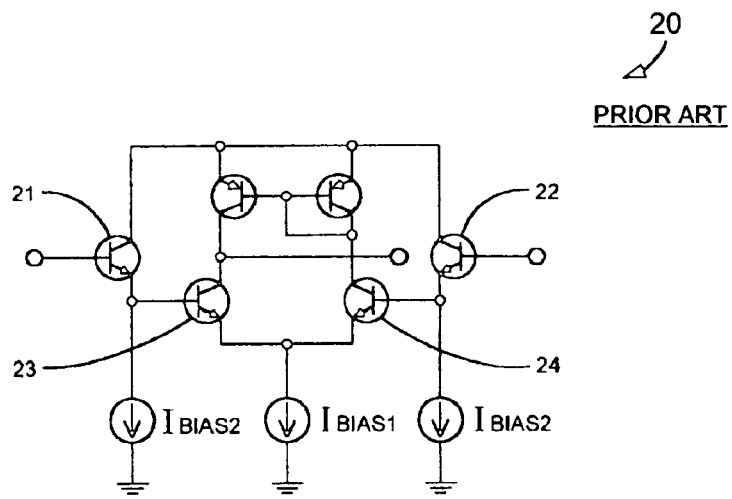
FIG. 2 is an electrical schematic of a typical emitter-coupled transistor pair form of an NPN based bipolar comparator, according to the prior art.

FIG. 2 shows, in electrical schematic form, a typical emitter coupled transistor pair form of an NPN-based bipolar comparator 20. Besides serving to shift the operable voltage range of the comparator 20, outer stage NPN transistors 21 and 22 also serve to supply base currents to a primary emitter coupled transistor pair, i.e., transistors 23 and 24. For purposes of accurate matching of the voltage drops across the base-emitter junctions of the transistors 21 and 22, on either side of the structure, it is desirable that equal bias currents (Ibias2) flow through each of the outer transistors 21 and 22. Without a specific bias current source, the transistors 21 and 22 conduct only the base current of their associated inner transistor 23 and 24. While this is desirable for purposes of minimizing the base currents supplying the outer transistors 21 and 22, any mismatch in the inner transistors 23 and 24 causes emitter current differences in the outer transistors 21 and 22, resulting in substantial differences in the base-emitter voltage (Vbe) of the outer transistors 21 and 22.

This voltage difference becomes an offset error voltage in the comparator 20. Providing matched bias currents for the outer transistors 21 and 22 also serves to increase the gain of the transistors 21 and 22, overcome base current differences in the inner transistors 23 and 24 and create equal Vbes in the two outer transistors 21 and 22, thereby increasing the accuracy of the comparator 20. While implementing the bias currents produces higher accuracy, these bias currents, reduced by the dc gain of the outer transistors 21 and 22, become the input currents for the comparator 20. Therefore, the design tradeoff becomes accuracy versus input current, with process variations in transistor gain being an additional factor.

It should be appreciated that matching accuracy for a comparator is only important at the point that the voltages being compared are substantially equal. When the voltages being compared are substantially different, the comparator is fully switched to a given state and there is no need to be concerned with mismatch-based errors in the circuit. Accordingly, the bias currents for the outer transistors can be essentially eliminated during the periods of large input differences. Since these periods represent the vast majority of the charging time for a timing capacitor, removing the bias currents and thereby reducing the input currents, by at least a couple of orders of magnitude, substantially reduces timing errors associated with comparator input currents.

The transition from one output state to the other output state occurs across a small differential input voltage range. This transition is may be defined by:

$$\tanh\left(\frac{Vid}{2 \circ Vt}\right)$$

where Vid is the differential input voltage across inputs of a comparator and Vt is the thermal voltage (defined by kT/q). In the preceding expression: k is Boltzman's constant, T is the temperature in degrees Kelvin and q is the electronic charge. At room temperature, Vt is approximately equal to 0.026V.

From review of the plot of the above equation, it is evident that the total swing in the output of the differential transistor pair occurs for a differential voltage swing of about 200 mV. In reality, after the output of the comparator is applied to a subsequent gain stage, the total differential voltage swing range necessary to cause downstream action will generally be less than about 100 mV. Outside of this range, accuracy in the comparator is generally not necessary and the bias currents needed to achieve the accuracy unnecessarily contribute to input current error. As a percentage of the total range of voltage that the timeout capacitor charges through, typically 2.5V to 3.5V, the range where accuracy is important is approximately 3 percent. Therefore, if the bias currents are present only during the time that the differential input voltage is within about +/−50 mV of a balance point, a significant improvement in timing accuracy can be achieved.

By allowing the comparator to control bias currents applied to the outer stage transistors of the comparator, input currents can be reduced. That is, during the operational stage where the input voltage from a timing capacitor node is significantly lower than a reference voltage applied to the other input of the comparator, the bias currents are effectively turned off. As the differential input voltage becomes small, the bias currents are turned on, e.g., in a non-linear fashion, and further increased as zero differential input is approached.

Figure 3:
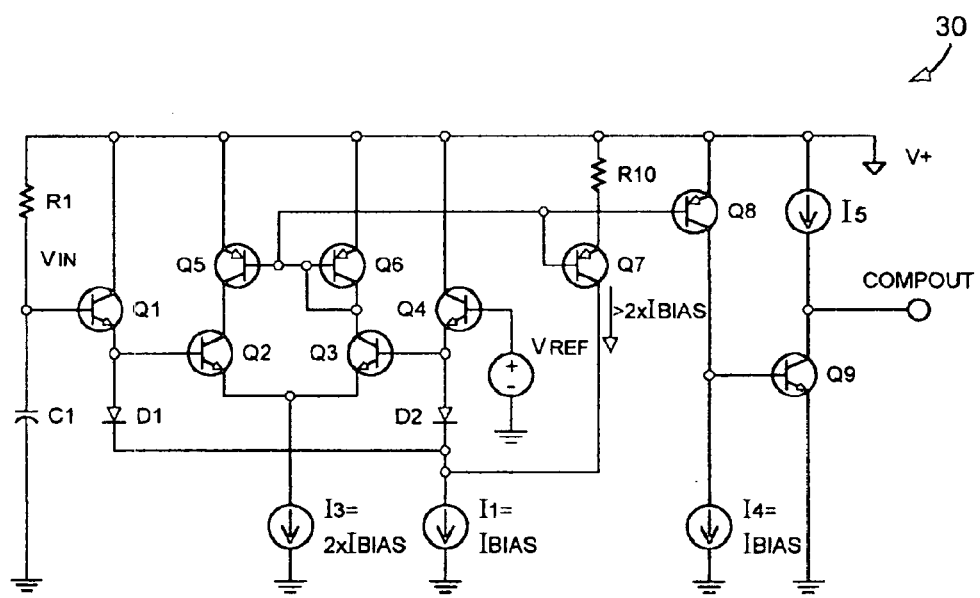
FIG. 3 is an electrical schematic of a bipolar comparator, according to one embodiment of the present invention.

With reference to FIG. 3, an electrical schematic depicts a comparator 30 that turns on bias currents as a differential input voltage becomes smaller. In FIG. 3, various current mirrors are depicted as current sources to simplify the explanation of operation. When the differential input voltage conditions are such that Vin is much less than Vref, i.e., the condition corresponding to the early stages of the capacitor C1 charging period, transistors Q1 and Q2 are in an off state with transistor Q3 conducting all of the current pulled by current source 13. A diode connected PNP transistor Q6 serves to form the reference for the current mirror composed of transistors Q5, Q6, Q7 and Q8. With the transistor Q6 also conducting a bias current equal to 2Ibias, the transistor Q8 conducts approximately the same current. The transistor Q7 conducts a current less than that conducted by the transistors Q6 and Q8, due to the presence of resistor R10 connected to the emitter of the transistor Q7. With regard to the timer comparator output state, the transistor Q8 collector current of approximately 2Ibias exceeds the current pulled by current source 14, thereby turning on transistor Q9 and pulling output COMPOUT low.

The transistor Q7 collector current, which is slightly less than 2Ibias, exceeds the current pulled by current source I1, reverse biasing diodes D1 and D2. With the diodes D1 and D2 reverse biased, there is no bias current applied to the transistors Q1 and Q4. Under this condition the input current, which is the base current of the transistor Q1, is defined by 2Ibias (current source I3) divided by the dc gain of the transistor Q2 and further divided by the dc gain of the transistor Q1. At a typical magnitude for Ibias of approximately 50 uA, the input current is approximately 5 nA (50 uA/100/100=5 nA).

As the voltage on the capacitor C1 approaches Vref, the current supplied by the current source 13 becomes split between the transistors Q2 and Q3. At Vin equal to Vref, the current is equally split between the transistors Q2 and Q3. With the transistors Q2 and Q3 equally splitting the current sourced by the current source I3, the current through the transistor Q6 is Ibias. Again, the transistor Q7 conducts less than Ibias due to the presence of the resistor R10. With less than Ibias sourced onto the common node between the diodes D1 and D2, the current source I1 forward biases the diodes D1 and D2 with equal currents. These diode currents become bias currents for the transistors Q1 and Q4, creating the matched bias conditions desired for best accuracy. The transistor Q8 also conducts a current Ibias matching the current drawn by the current source I4 and leaving no base drive for the transistor Q9. Any additional increase in the voltage across the capacitor C1 results in the transistor Q8 current becoming less than the current drawn by the current source I4, resulting in the transistor Q9 being substantially turned off.

By designing a comparator to drive its own bias conditions, the comparator is brought into the optimal bias condition without the need for additional circuitry to monitor the comparator state. At the Vid=0 condition, the transistors on both sides of the differential pair are equally biased with sufficient current to provide good matching. The actual balance point bias of the transistors Q1 and Q4 is determined by the choice of value of the resistor R10, which reduces the current in the transistor Q7 relative to that in the other transistors in the PNP current mirror rail. The amount by which this current is reduced becomes the sum of the bias currents drawn through the transistors Q1 and Q4. The calculations necessary to determine an application appropriate value for the resistor R10 are well within the ability of one skilled in the art and, as such, are not further discussed herein.

Figure 4:
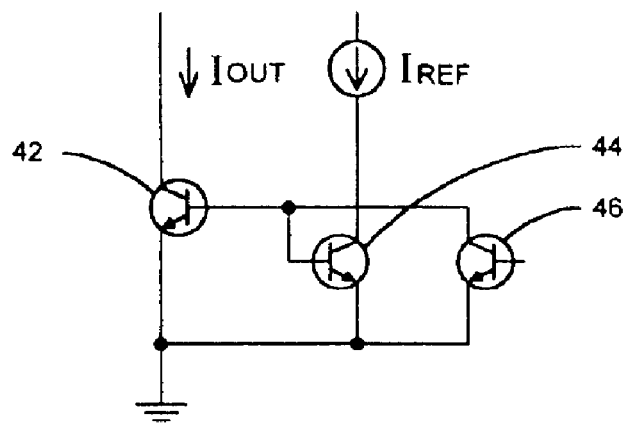
FIG. 4 is an electrical schematic of an exemplary current source, according to the prior art.

In addition to minimizing the current drawn from the capacitor C1 node by the comparator input, it is desirable to design the blinding timer discharge current source so as to minimize its current draw during the capacitor C1 charging period. This current source can be constructed as a basic NPN current mirror 40 (see FIG. 4). When not discharging the capacitor C1, the mirror 40 can be held off by another NPN transistor 46, whose collector is connected to bases of the mirror transistors 42 and 44. However, this configuration may not provide a sufficient "off" condition under high temperature conditions. At high temperatures, the base-emitter voltage (Vbe) of the NPN transistors become so small that the saturated collector-emitter voltage (Vce) of the switching transistor cannot turn these devices off to where they are only conducting currents in the few nanoamp range.

Figure 5:
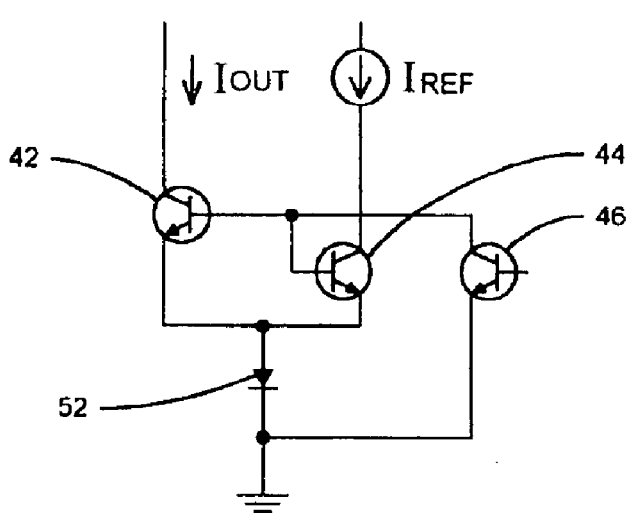
FIG. 5 is an electrical schematic of a current source, implemented according to one embodiment of the present invention.

According to one embodiment of the present invention, a blinding timer circuitry discharge source 50 is configured as shown in FIG. 5. By placing the current mirror 40 in series with another diode connected NPN transistor (shown as a diode) 52, the additional voltage drop associated with the series diode provides additional bias voltage on the emitters of the mirror transistors 42 and 44 that must be overcome before the transistors 42 and 44 conduct current. With this additional voltage in place, the saturation voltage of the switching transistor 46 is sufficiently low to allow a full "off" state of the mirror 40, reducing the output device's collector current to that of its leakage current. This leakage current can then be compensated for by use of an integrated leakage compensating structure of the form described in U.S. Pat. No. 6,369,646, which is hereby incorporated herein in its entirety. Such compensation reduces the net current drawn at the capacitor C1 node to only a few nanoamps for temperatures as high as 160 degrees C.

Figure 6:
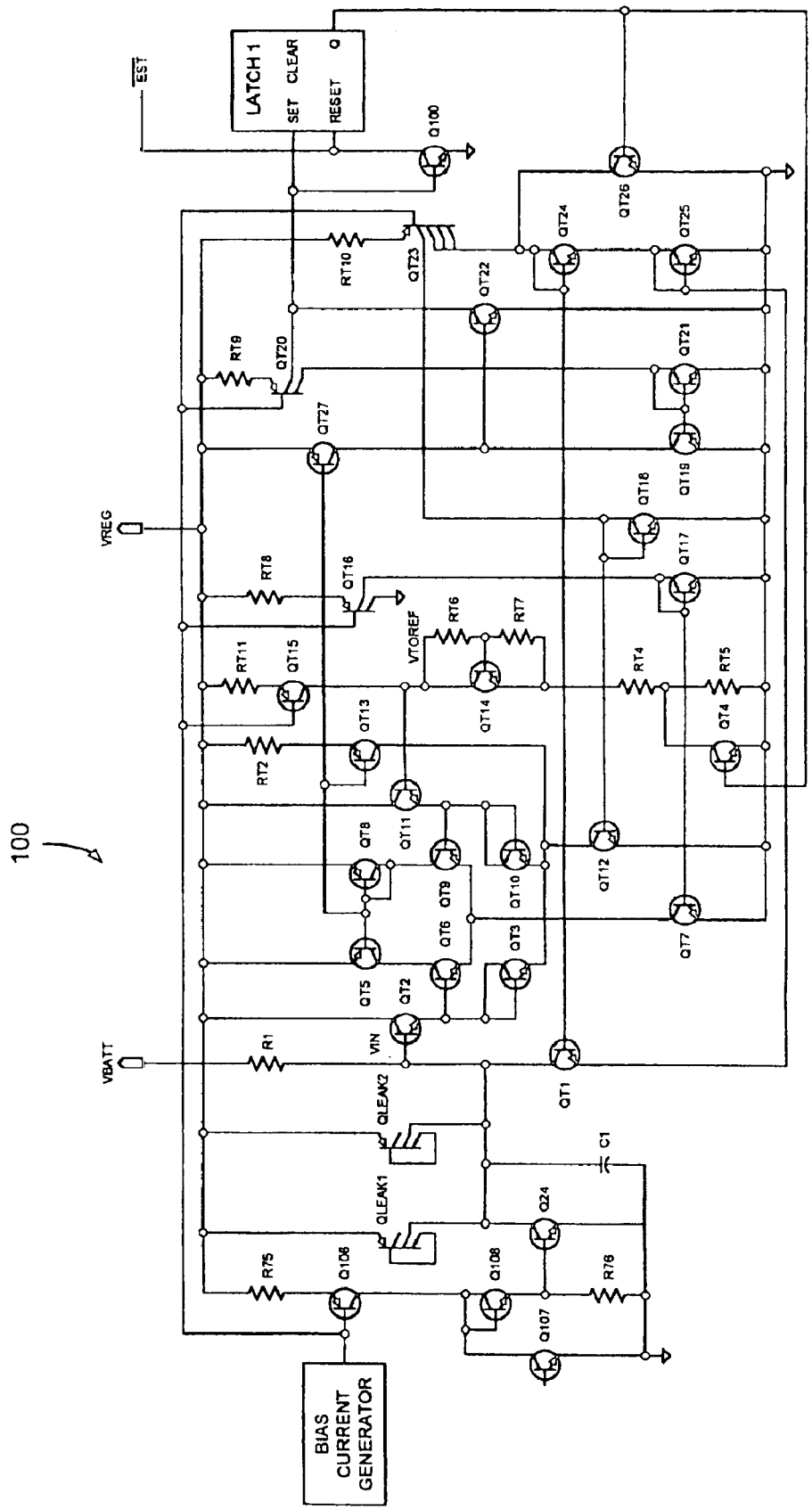
FIG. 6 is a transistor level schematic of an over-dwell protection circuit implemented with a blinding timer constructed according to one embodiment of the present invention.

Finally, to insure that the NPN transistor that performs the basic switching function at the capacitor node (i.e., the capacitor C1/resistor R1 junction) is also sufficiently turned off during the capacitor charging period, its base is resistively pulled to ground. Additionally, the current providing base drive to this device is passed through a series diode. The presence of the diode allows a prior switching device to shunt all of the drive current to ground, allowing the resistor connected to the base of the switching transistor to turn that device completely off. This configuration is shown in FIG. 6, where transistor Q24 is the primary switching device and transistor Q108 is configured as the series diode. The leakage current associated with the switching transistor can also be compensated for by use of the aforementioned leakage compensating structures.

By combining the comparator structure with self-controlled biasing, the modified discharge current source and the considerations for turning off the main switching NPN transistor, a dual function timer is provided with input error currents on the order of 0.5 percent of the capacitor charging current across a temperature range of about −40° C. to 160° C.

With reference to FIG. 6, a transistor level schematic 100 of one embodiment of the present invention is shown. Transistors QT6 and QT9 form a basic emitter-coupled transistor pair of a comparator. Timing capacitor C1 and timing resistor R1 are connected at node "Vin"0 at the base of transistor QT2. This is the node of interest for maintaining minimal current perturbation. Diode connected transistors QT3 and QT10 are represented by diodes D1 and D2 in FIG. 3. Transistors QT7 and QT17 form the current source 13 (FIG. 3) and transistors QT12 and QT18 form the current source I1. The current source 14 (see FIG. 3) is composed of transistors QT19 and QT21. Transistor QT13 of FIG. 6 corresponds to the transistor Q7, of FIG. 3, and resistor RT2 corresponds to the resistor R10 of FIG. 3.

The reference voltage is established at node VTOREF by developing a local silicon bandgap voltage based reference using transistor QT14 and resistors RT4, RT5, RT6 and RT7 in conjunction with the current sourced by the collector of transistor QT15. The collector current of the transistor QT15 is defined by a "delta Vbe" current source of common design. The lower reference voltage used to define the end of the blinding time period is developed by transistor QT4 effectively removing the resistor RT5 from the reference voltage circuit. The transistor QT1 is the output transistor of the blinding timer capacitor discharge current source formed by the transistors QT1 and QT24 and diode connected transistor QT25, which forms the offsetting diode referenced in the discussion of the circuit shown in FIG. 5.

The transistor QT24, the primary capacitor C1 switching transistor, is held off by resistor R76 when transistor Q107 is turned on. Devices Qleak1 and Qleak2 represent the leakage compensating devices discussed above with reference to U.S. Pat. No. 6,369,646.

Accordingly, a comparator circuit has been described herein that advantageously controls its bias currents. Such a comparator circuit may be advantageously employed in automotive ignition systems implementing over-dwell and blinding timer functions with an external capacitor.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A comparator circuit with controlled outer transistor stage bias currents, comprising:
    an outer transistor stage, including:
        a first transistor including a signal input terminal, a first output terminal and a second output terminal; and
        a second transistor including a reference input terminal, a first output terminal and a second output terminal, wherein the first and second output terminals of the first and second transistors are coupled across a power source, and wherein the first and second transistors of the outer transistor stage provide drive currents to transistors of an inner transistor stage;
    bias current control circuitry for controlling bias currents associated with the first and second transistors, wherein the bias current control circuitry minimizes the bias currents when a difference between a magnitude of an input signal at the signal input terminal and a magnitude of a reference signal applied to the reference input terminal is greater than a predetermined value, and wherein the bias current control circuitry increases the bias currents associated with the comparator circuit when the difference between the magnitude of the input signal at the signal input terminal and the magnitude of the reference signal at the reference input terminal is less than the predetermined value; and
    a blinding timer discharge current source configured to limit current drawn by a capacitor coupled to the input signal terminal being charged, wherein the blinding timer discharge current source is coupled across the capacitor.

2. The comparator circuit of claim 1, wherein the input and reference signals are voltage signals.

3. The comparator circuit of claim 1, wherein the bias currents are increased to a maximum value when the difference between the magnitude of the input signal at the signal input terminal and the magnitude of the reference signal at the reference input terminal is less than the predetermined value.

4. The comparator circuit of claim 1, wherein the bias currents are at a desired magnitude when the magnitudes of the input and reference signals are substantially equal.

5. The comparator circuit of claim 1, wherein the signal input terminal is a non-inverting input and the reference input terminal is an inverting input.

6. The comparator circuit of claim 1, wherein the predetermined value is about 50 mV.

7. The comparator circuit of claim 1, wherein the transistors are bipolar transistors.

8. A method for reducing input currents associated with a comparator circuit during certain events, comprising the steps of:
    minimizing bias currents associated with a comparator circuit when a difference between a magnitude of an input signal at a signal input of the comparator circuit and a magnitude of a reference signal applied to a reference input of the comparator circuit is greater than a predetermined value;
    increasing the bias currents associated with the comparator circuit when the magnitude of the input signal at the signal input of the comparator circuit and the magnitude of the reference signal at the reference input of the comparator circuit is less than the predetermined value; and
    coupling a blinding timer discharge current source across a capacitor operatively coupled to the comparator signal input and configuring said blinding timer discharge current source to limit current drawn thereby while said capacitor is being charged.

9. The method of claim 8, wherein the bias currents are applied to outer stage transistors of the comparator circuit.

10. The method of claim 8, wherein the input and reference signals are voltage signals.

11. The method of claim 8, wherein the bias currents are increased when the difference between the magnitude of the input signal at the signal input of the comparator circuit and the magnitude of the reference signal at the reference input of the comparator circuit is less than the predetermined value.

12. The method of claim 8, wherein the bias currents are at a desired magnitude when the magnitudes of the input and reference signals are substantially equal.

13. The method of claim 8, wherein the signal input is a non-inverting input and the reference input is an inverting input.

14. The method of claim 8, wherein the predetermined value is about 50 mV.

15. An automotive ignition system including a comparator circuit with controlled outer transistor stage bias currents, the comparator circuit comprising:
- an outer transistor stage, including:
  - a first transistor including a signal input terminal, a first output terminal and a second output terminal; and
  - a second transistor including a reference input terminal, a first output terminal and a second output terminal, wherein the first and second output terminals of the first and second transistors are coupled across a power source, and wherein the first and second transistors of the outer transistor stage provide drive currents to transistors of an inner transistor stage;
- bias current control circuitry for controlling bias currents associated with the first and second transistors, wherein the bias current control circuitry minimizes the bias currents when a difference between a magnitude of an input signal at the signal Input terminal and a magnitude of a reference signal applied to the reference input terminal is greater than a predetermined value, and wherein the bias current control circuitry increases the bias currents associated with the comparator circuit when the difference between the magnitude of the input signal at the signal input terminal and the magnitude of the reference signal at the reference input terminal is less than the predetermined value, where the bias currents are at a desired magnitude when the magnitudes of the input and reference signals are substantially equal;
- a capacitor coupled across the signal input terminal of the first transistor and a signal return line;
- a switch coupled across the capacitor; and a blinding timer discharge current source coupled to the signal input terminal of the transistor, wherein the blinding tinier discharge current source is configured to substantially reduce its leakage current when the switch is off.

16. The system of claim 15, wherein the signal input terminal is a non-inverting input and the reference input terminal is an inverting input.

17. A comparator circuit with controlled outer transistor stage bias currents, comprising:
- an outer transistor stage, including:
  - a first transistor including a signal input terminal, a first output terminal and a second output terminal; and
  - a second transistor including a reference input terminal, a first output terminal and a second output terminal, wherein the first and second output terminals of the first and second transistors are coupled across a power source, and wherein the first and second transistors of the outer transistor stage provide drive currents to transistors of an inner transistor stage; and
- bias current control circuitry for controlling bias currents associated with the first and second transistors, wherein the bias current control circuitry minimizes the bias currents when a difference between a magnitude of an input signal at the signal input terminal and a magnitude of a reference signal applied to the reference input terminal is greater than a predetermined value, and wherein the bias current control circuitry increases the bias currents associated with the comparator circuit when the difference between the magnitude of the input signal at the signal input terminal and the magnitude of the reference signal at the reference input terminal is less than the predetermined value,
- wherein the signal input terminal includes an associated leakage current compensation circuit.

18. The comparator circuit of claim 17, wherein the input and reference signals are voltage signals.

19. The comparator circuit of claim 17, wherein the bias currents are increased to a maximum value when the difference between the magnitude of the input signal at the signal input terminal and the magnitude of the reference signal at the reference input terminal is less than the predetermined value.

20. The comparator circuit of claim 17, wherein the bias currents are at a desired magnitude when the magnitudes of the input and reference signals are substantially equal.

21. The comparator circuit of claim 17, wherein the signal input terminal is a non-inverting input and the reference input terminal is an inverting input.

22. The comparator circuit of claim 17, wherein the predetermined value is about 50 mV.

23. The comparator circuit of claim 17, wherein the transistors are bipolar transistors.

* * * * *